United States Patent [19]
Yang et al.

[11] Patent Number: 6,107,172
[45] Date of Patent: Aug. 22, 2000

[54] CONTROLLED LINEWIDTH REDUCTION DURING GATE PATTERN FORMATION USING AN SION BARC

[75] Inventors: Chih-Yuh Yang; Scott A. Bell; Daniel Steckert, all of San Jose, Calif.

[73] Assignee: Advanced Micro Devices, Inc., Sunnyvale, Calif.

[21] Appl. No.: 08/905,104

[22] Filed: Aug. 1, 1997

[51] Int. Cl.[7] ................ H01L 21/3205; H01L 21/4763; H01L 21/44; H01L 21/302
[52] U.S. Cl. .................. 438/585; 438/636; 438/671; 438/738; 438/951; 438/952
[58] Field of Search .................. 438/671, 636, 438/738, 951, 952, 585

[56] References Cited

U.S. PATENT DOCUMENTS

| | | |
|---|---|---|
| 5,392,124 | 2/1995 | Barbee et al. . |
| 5,431,770 | 7/1995 | Lee et al. . |
| 5,545,578 | 8/1996 | Park et al. . |
| 5,567,631 | 10/1996 | Hsu et al. . |
| 5,580,700 | 12/1996 | Rahman . |
| 5,600,165 | 2/1997 | Tsukamoto et al. . |
| 5,620,912 | 4/1997 | Hwang et al. . |
| 5,674,356 | 10/1997 | Nagayama . |
| 5,747,388 | 5/1998 | Kusters et al. . |
| 5,804,088 | 9/1998 | McKee . |
| 5,846,878 | 12/1998 | Horiba . |
| 5,854,132 | 12/1998 | Pramanick et al. . |
| 5,858,854 | 1/1999 | Tsai et al. . |

OTHER PUBLICATIONS

Sze, S.M., Semiconductor Devices Physics and Technology, John Wiley & Sons, pp. 458–460, 1985.

G.V. Thakar, V.M. McNeil, S.K. Madan, B.R. Riemenschneider, D.M. Rogers, J.A. McKee, R. H. Eklund and R.A. Chapman, "A Manufacturable High Performance Quarter Micron CMOS Technology Using I–Line Lithography and Gate Linewidth Reduction Etch Process", IEEE, 1996, p. 216–217.

Wei W. Lee, Qizhi He, Maureen Hanratty, Dary Rogers, Amitava Chatterjee, Robert Kraft and Richard A. Chapman, "Fabrication of 0.06 um Poly–Si Gate Using DUV Lithography With a Designed $Si_xO_yN_z$ Film as an Arc and Hardmask", IEEE, Jan., 1997, p. 131–132.

*Primary Examiner*—John F. Niebling
*Assistant Examiner*—Josetta I. Jones

[57] ABSTRACT

A gate is formed by creating a wafer stack, that includes a gate conductive layer over a substrate layer, depositing a $SiO_xN_y$ layer over the conductive layer to act as a bottom anti-reflective coating (BARC), and forming a resist mask on the $SiO_xN_y$ layer. Next, the resist mask is isotropically etched to further reduce the critical dimensions of the gate pattern formed therein, and then the underlying BARC and wafer stack are etched to form a gate out of the conductive layer.

19 Claims, 2 Drawing Sheets

CONTROLLED LINEWIDTH REDUCTION DURING GATE PATTERN FORMATION USING AN SION BARC

TECHNICAL FIELD

The present invention relates to semiconductor devices and manufacturing processes, and more particularly to methods for forming conductive gates within a semiconductor device using a silicone oxynitride ($SiO_xN_y$, referred to hereinafter simply as SiON) film as a bottom anti-reflective coating (BARC) and a photoresist mask.

BACKGROUND ART

A continuing trend in semiconductor technology is to build integrated circuits with more and/or faster semiconductor devices. The drive toward this ultra large scale integration has resulted in continued shrinking of device and circuit dimensions and features. In integrated circuits having field-effect transistors, for example, one very important process step is the formation of the gate for each of the transistors, and in particular the dimensions of the gate. In many applications, the performance characteristics (e.g., switching speed) and size of the transistor are functions of the size (e.g., width) of the transistor's gate. Thus, for example, a narrower gate tends to produce a higher performance transistor (e.g., faster) that is inherently smaller in size (e.g., narrower width).

As is often the case, however, there are limitations to existing techniques that reduce their effectiveness or even exclude their use in fabricating the next generation of integrated circuit devices. For example, the limitations of conventional lithographic techniques and tools, which are used to pattern the gates during fabrication, are quickly being realized. Accordingly, there is a continuing need for more efficient and effective fabrication processes for forming transistor gates that are smaller and/or exhibit higher performance.

SUMMARY OF THE INVENTION

The present invention provides methods for forming a gate or other conductive line on a semiconductor substrate that uses an SiON film as a bottom anti-reflective coating (BARC), and an additional etching process to further trim the resist mask before etching through one or more underlying layers in a wafer stack.

Thus, in one embodiment of the present invention, a method is provided for forming a gate structure from a semiconductor wafer stack. The method includes depositing a $SiO_xN_y$ layer on a conductive layer. The $SiO_xN_y$ layer is arranged to function as a BARC during subsequent lithography processes. Next, the method includes depositing a resist layer on the $SiO_xN_y$ layer and forming a first resist mask with the resist layer using the $SiO_xN_y$ layer as a BARC. The first resist mask includes at least one initial line having an initial width. The method then includes forming a second resist mask by isotropically etching the first resist mask, such that portions of the initial line are removed to form a final line having a final width. As such, the final width is narrower than the initial width. Next, the method includes etching through selected portions of the $SiO_xN_y$ layer, as defined by the final resist mask, and then etching through selected portions of the gate conductive layer to form a gate from the gate conductive layer. The result is that the gate has a width substantially equal to the final width of the final resist mask as previously patterned. As such, in certain embodiments, the resulting gate is advantageously narrower than the patterning limitations of the lithographic technology applied during the formation of the initial resist mask.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drown to scale, but instead are drawn so as to illustrate the important features of the present invention.

In accordance with the present invention, there are provided a methods for forming at least one gate within an integrated circuit using a silicon oxynitride (e.g., $SiO_xN_y$, referred to herein simply as SiON) film as a bottom anti-reflective coating (BARC), and a trim etch process that controllably trims or reduces the critical dimension (CD) of the gate pattern in the resist mask. By reducing the CD of the initial gate pattern, the methods of the present invention allow smaller gates to be formed, thereby extending the capability of typical lithographic techniques beyond their current resolution limitations.

Figure 1:
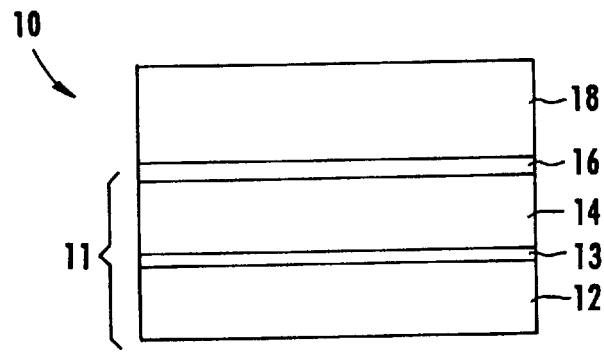
FIG. 1 depicts a cross-section of a portion of a semiconductor wafer that has been prepared for gate conductor formation, in accordance with an embodiment of the present invention.

With this in mind, FIG. 1 depicts a cross-section of a portion 10 of a semiconductor device being fabricated on a semiconductor wafer, in accordance with the present invention. Portion 10 includes a wafer stack 11 having a plurality of layers including a substrate 12 and a gate conductive layer 14. As depicted, there is also a SiON BARC 16 and a resist layer 18. By way of example, resist layer 18, in certain embodiments, is a conventional deep-UV resist material applied to BARC 16 using conventional techniques. In accordance with one embodiment of the present invention, substrate 12 includes a silicon layer, approximately 2 mm thick. Additionally, portion 10 preferably includes a thin oxide layer 13 that acts as a barrier between gate conductive layer 14 and the lower portions of substrate 12. For example, in one embodiment of the present invention, thin oxide layer 13 is an oxide film that is approximately 55 Å thick. Gate conductive layer 14, in one embodiment, is a layer of polycrystalline silicon, approximately 1,700 Å thick, which is formed on top of substrate 12.

BARC 16, which is preferably a thin film of SiON, is then applied on top of gate conductive layer 14. The benefits of using a BARC are known in the art. For example, BARC 16 can be tuned to suppress a particular wavelength associated with interference waves and/or standing waves produced by one or more underlying layers during the patterning of resist layer 18 to form an initial resist mask 20 (see FIG. 2). Thus, as discussed in greater detail below, when combined with the proper lithographic techniques, BARC 16 allows for better process control in the resist patterning which allows for the subsequent formation of smaller gates. Furthermore, BARC 16 acts as a barrier layer between gate conductive layer 14 and resist layer 18.

BARC 16, in accordance with the present invention, is preferably tuned, through process conditions, to absorb deep-UV wavelengths (e.g., 248 nm) during the creation of initial resist mask 20 using conventional deep-UV lithography techniques. As will be appreciated by those skilled in the art, the deposition of BARC 16, for example, through conventional CVD techniques, creates a more uniform layer when compared to a typical spin-on organic BARC material. This provides better process control over the traditional spin-on techniques that are often harder to control and more likely to introduce defects, such as, for example, through contaminants. In a preferred embodiment, BARC 16 is a SiON layer that has been deposited using PECVD. In certain embodiments, BARC 16 is further exposed to a $N_2O$ treatment, in-situ, to form a very-thin oxide skin that acts a passivation layer to avoid contamination from resist layer 18.

In FIGS. 2 through 6, portion 10 is depicted within a dashed line box that represents a reactor chamber 40 in which the etching processes of the present invention are conducted. Additionally, a biasing power supply 42 is depicted as a block diagram in FIGS. 2 through 6. Biasing power supply 42 is a conventional power supply that is configured to supply electrical power to the plasma reactor during certain etching processes.

Figure 2:
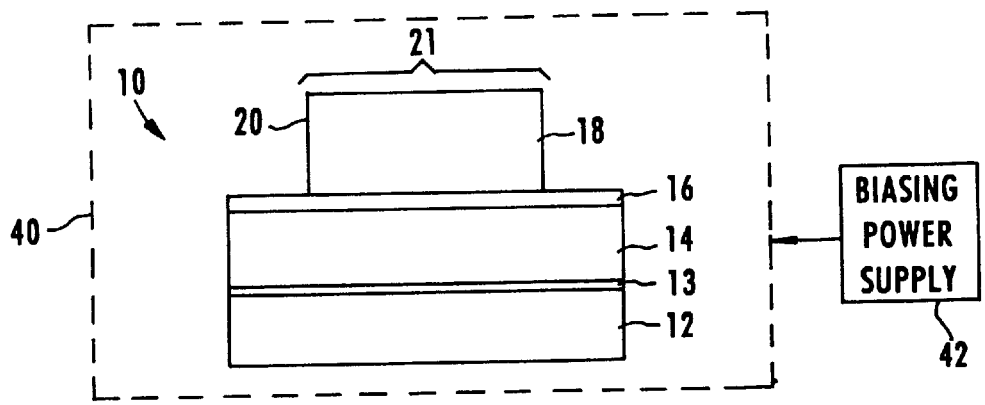
FIG. 2 depicts the portion of FIG. 1 following formation of an initial resist mask, in accordance with an embodiment of the present invention.
Figure 3:
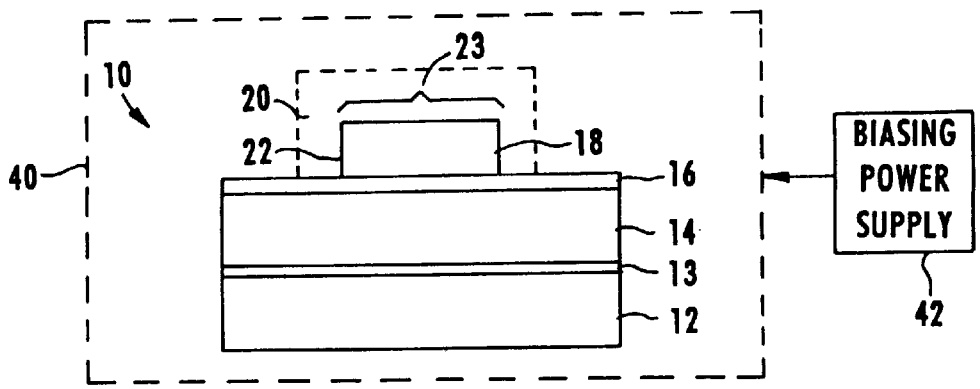
FIG. 3 depicts the portion of FIG. 2 following a trim etch process that trims the initial resist mask into a final resist mask, in accordance with an embodiment of the present invention.

As shown in FIG. 2, initial resist mask 20 has an initial line width 21. In accordance with the present invention, the initial line width 21 of the initial resist mask 20 is wider than the desired gate to be formed. As such, a trim etch process is used, in accordance with the present invention, to further reduce the initial line width 21 to match the desired gate width. The trim etch process includes isotropically etching away a portion of initial resist mask 20 to produce a final resist mask 22, as depicted in FIG. 3, that has a final line width 23 that is approximately equal to the desired gate width.

The novel trim etch process etching recipe(s), in accordance with the present invention, are preferably used to etch a semiconductor wafer as described above within a plasma etching tool, such as a parallel plate RIE plasma system, for example an AMAT P5000 available from Applied Materials of Santa Clara, Calif. However, those skilled in the art will recognize that the various parameters associated with the etching process and recipes are adjustable for differing arrangements, semiconductor wafers, layer stacks, layer materials, etching tools, and other common semiconductor manufacturing apparatus. For example, an etching recipe in accordance with an embodiment of the present invention is provided, below, for use in a high density plasma etching system, such as, for example, the AMAT DPS system available from Applied Materials, or a LAM TCP system available from LAM Research of Fremont, Calif. It is further recognized that the present invention can be practiced with or without all of the parameters being adjusted or provided as described herein.

The trim etch process, in accordance with one embodiment of the present invention, preferably includes isotropically etching away portions of initial resist mask 20 using a mixture of either: (1) HBr and $O_2$; (2) HBr and $HeO_2$; or, (3) $N_2$, He and $O_2$.

By way of example, in one embodiment the reactor chamber 40 of a RIE plasma system is supplied with a mixture of gases at a rate that is preferably between approximately 40 to 150 sccm. This preferred gas mixture includes between approximately 10 to 60% HBr, 40 to 90% $O_2$, and 0 to 40% inert gas (e.g., Ar, He, and the like). Additionally, in certain embodiments, a biasing power of approximately 150 to 400 Watts (W) is also supplied to the reactor chamber 40. It is also preferred that the pressure in the reactor chamber 40 be maintained at between approximately 20 to 150 mT.

In another exemplary embodiment, the reactor chamber 40 of a high density plasma system is supplied with a mixture of gases at a rate that is preferably between approximately 50 to 170 sccm. This preferred gas mixture includes between approximately 10 to 60% HBr, 40 to 90% $O_2$, and 0 to 40% inert gas (e.g., Ar, He, and the like). Additionally, in certain embodiments, a biasing power of approximately 400 to 1000 Watts (W) is also supplied to the reactor chamber 40. It is also preferred that the pressure in the reactor chamber 40 be maintained at between approximately 3 to 10 mT.

Figure 4:
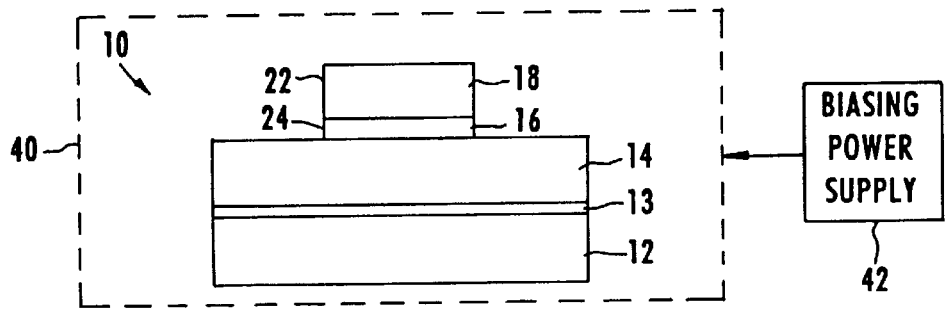
FIG. 4 depicts the portion of FIG. 3 following a BARC etching process, in accordance one embodiment of the present invention.

FIG. 4 depicts portion 10 of FIG. 3 following a BARC etching process in which the pattern of final resist mask 22 is essentially transferred to BARC 16 by anisotropically etching away exposed portions of BARC 16. As depicted, the BARC etching process creates a hardmask 24 which leaves selected portions of gate conductive layer 14 exposed. The BARC etching process preferably exhibits a high-selectivity to the material in gate conductive layer 14.

Figure 5:
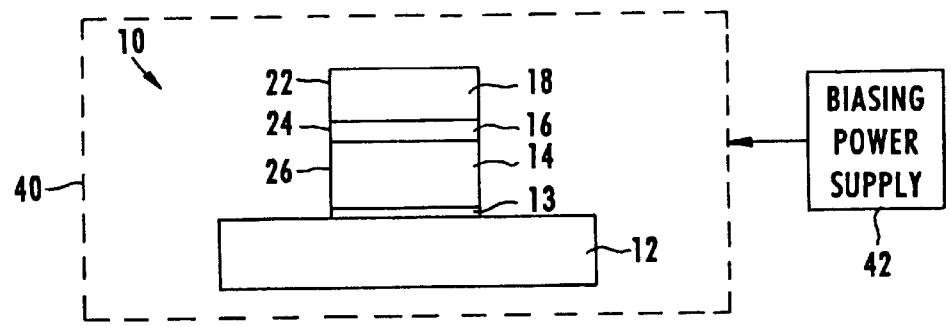
FIG. 5 depicts the portion of FIG. 4 following a gate conductive layer etching process, in accordance with an embodiment of the present invention.

FIG. 5 depicts portion 10 of FIG. 4 following a gate conductive layer etching process in which exposed portions of gate conductive layer 14 are etched away. As depicted, the gate conductive layer etching process, which is preferably an anisotropic etching process, removed the exposed portions of gate conductive layer 16 and stopped on substrate 12. Thus, for example, if gate conductive layer 14 is a layer of polysilicon then the gate conductive layer etching process will preferably have a high-selectivity to the material on top of substrate 12, such as, for example, an oxide layer. The result of the gate conductive layer etching process is that a gate 26 is formed having substantially the same width as final line width 23.

Figure 6:
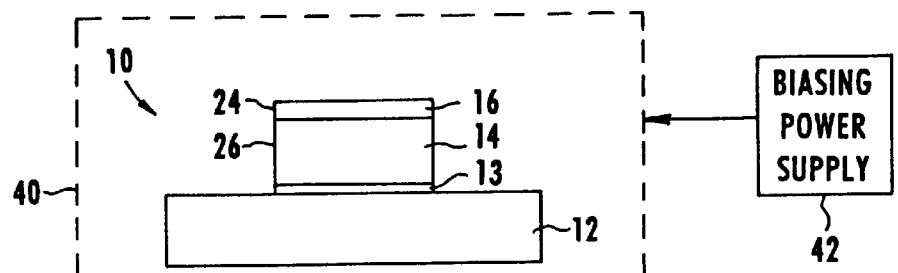
FIG. 6 depicts the portion of FIG. 5 following a resist mask removal process, in accordance with an embodiment of the present invention.
Figure 7:
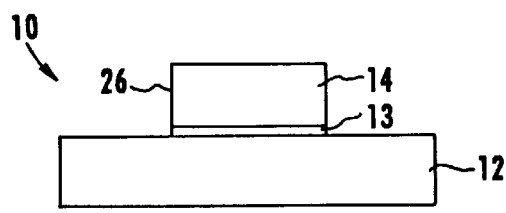
FIG. 7 depicts the portion of FIG. 6 having a completed gate, following a second BARC etching process, in accordance with an embodiment of the present invention.

Next, in FIG. 6, portion 10 of FIG. 5 has had the remaining portions of final resist mask 22 stripped, for example, using conventional wet resist strip techniques. Similarly, in FIG. 7, portion 10 of FIG. 6 has been processed, as in the previous BARC etching process, to remove the remaining portions of BARC 16 in hardmask 24. As a result, gate 23 is fully exposed and can then be used to form completed transistors in subsequent fabrication processes.

Thus, the use of this novel process that employs an SiON BARC and a trim etch process to form gates, in accordance with the present invention, allows for a gate having a smaller width which tends to translate to improved performance and increased circuit density.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a gate structure from a semiconductor wafer stack comprising a substrate and a conductive layer above the substrate, the method comprising:

depositing a $SiO_xN_y$ layer on the conductive layer, wherein the $SiO_xN_y$ layer is arranged to function as a bottom anti-reflective coating;

depositing a resist layer on the $SiO_xN_y$ layer;

forming a first resist mask with the resist layer while using the $SiO_xN_y$ layer as a bottom anti-reflective coating, wherein the first resist mask defines a first line having a first width;

isotropically etching the first resist mask to create a second resist mask, such that portions of the first line are removed to form a second line having a second width, wherein the second width is narrower than the first width;

etching through selected portions of the $SiO_xN_y$ layer as defined by the second resist mask; and etching through selected portions of the gate conductive layer as defined by the etched $SiO_xN_y$ layer to form a gate from the gate conductive layer, wherein the gate has a gate width substantially equal to the second width, wherein the $SiO_xN_y$ layer is configured to attenuate interference waves produced in forming the first resist mask.

2. The method as recited in claim 1, wherein the gate conductive layer includes a polycrystalline silicon layer.

3. The method as recited in claim 1, wherein the first resist mask is formed using deep-UV waveforms and the $SiO_xN_y$ layer attenuates interference waves having an approximate wavelength of 248 nm.

4. The method as recited in claim 1, wherein the step of isotropically etching the first resist mask to create a second resist mask includes a trim etch process in a plasma etching system.

5. The method as recited in claim 4, wherein a reactor within the plasma etching system is supplied with a mixture of gases including HBr and $O_2$.

6. The method as recited in claim 4, wherein a reactor within the plasma etching system is supplied with a mixture of gases including HBr and $HeO_2$.

7. The method as recited in claim 4, wherein a reactor within the plasma etching system is supplied with a mixture of gases including $N_2$, He and $O_2$.

8. The method as recited in claim 4, wherein a reactor within the plasma etching system is supplied with a mixture of gases including between approximately 10 to 60% HBr, 40 to 90% $O_2$, and 0 to 40% inert gas.

9. The method as recited in claim 8, wherein inert gas is selected from Ar and He.

10. The method as recited in claim 4, wherein the plasma etching system is a reactive ion etching system.

11. The method as recited in claim 10, wherein a reactor within the reactive ion etching system is supplied with a mixture of gases at a rate between approximately 40 and 150 sccm, during the trim etch process.

12. The method as recited in claim 10, wherein a reactor within the reactive ion etching system is supplied with a biasing power of between approximately 150 and 400 Watts, during the trim etch process.

13. The method as recited in claim 10, wherein a reactor within the reactive ion etching system has a pressure that is maintained at between approximately 20 and 150 mT, during the trim etch process.

14. The method as recited in claim 4, wherein the plasma etching system is a high density plasma etching system.

15. The method as recited in claim 10, wherein a reactor within the high density plasma etching system is supplied with a mixture of gases at a rate between approximately 50 and 170 sccm, during the trim etch process.

16. The method as recited in claim 10, wherein a reactor within the high density plasma etching system is supplied with a biasing power of between approximately 400 and 1000 Watts, during the trim etch process.

17. The method as recited in claim 10, wherein a reactor within the high density plasma etching system has a pressure that is maintained at between approximately 3 and 10 mT, during the trim etch process.

18. A method for forming a gate structure from a semiconductor wafer stack comprising a substrate and a conductive layer above the substrate, the method comprising:

depositing a $SiO_xN_y$ layer on the conductive layer, wherein the $SiO_xN_y$ layer is arranged to function as a bottom anti-reflective coating;

depositing a resist layer on the $SiO_xN_y$ layer;

forming a first resist mask with the resist layer while using the $SiO_xN_y$ layer as a bottom anti-reflective coating, wherein the first resist mask defines a first line having a first width;

isotropically etching the first resist mask to create a second resist mask, such that portions of the first line are removed to form a second line having a second width, wherein the second width is narrower than the first width;

etching through selected portions of the $SiO_xN_y$ layer as defined by the second resist mask;

etching through selected portions of the gate conductive layer as defined by the etched $SiO_xN_y$ layer to form a gate from the gate conductive layer, wherein the gate has a gate width substantially equal to the second width; and removing the $SiO_xN_y$ layer and the second resist mask from the gate.

19. A method for forming a gate on a semiconductor wafer using a bottom anti-reflective coating and a trim etch process, the method comprising:

creating a wafer stack by forming a gate conductive layer over a substrate, depositing a $SiO_xN_y$ layer over the conductive layer to act as a bottom anti-reflective coating, and forming a resist mask on the $SiO_xN_y$ layer;

isotropically etching the resist mask to reduce a width of a gate line pattern formed therein; and shaping the wafer stack using the isotropically etched resist mask by sequentially etching through exposed portions of the $SiO_xN_y$ layer and the gate conductive layer, wherein the $SiO_xN_y$ layer is configured to attenuate interference waves produced in forming the resist mask.

* * * * *